United States Patent
Nishimoto et al.

(10) Patent No.: US 6,225,236 B1
(45) Date of Patent: May 1, 2001

(54) METHOD FOR REFORMING UNDERCOATING SURFACE AND METHOD FOR PRODUCTION OF SEMICONDUCTOR DEVICE

(75) Inventors: Yuhko Nishimoto; Setsu Suzuki, both of Tokyo (JP)

(73) Assignees: Canon Sales Co., Inc.; Semiconductor Process Laboratory Co., Ltd., both of (JP)

( * ) Notice: Subject to any disclaimer, the term of this patent is extended or adjusted under 35 U.S.C. 154(b) by 0 days.

(21) Appl. No.: 09/095,750

(22) Filed: Jun. 11, 1998

(30) Foreign Application Priority Data

Feb. 12, 1998 (JP) ................................................ 10-030178

(51) Int. Cl.[7] ............................ H01L 21/31; H01L 21/469
(52) U.S. Cl. ............................ 438/778; 438/436; 438/760; 438/761; 438/787
(58) Field of Search ................................... 438/428, 436, 438/438, 760, 761, 778, 787, 788, 789, 790

(56) References Cited

U.S. PATENT DOCUMENTS

| 5,051,380 | * | 9/1991 | Maeda et al. ........................ 438/761 |
| 5,212,119 | | 5/1993 | Hah et al. . |
| 5,376,591 | * | 12/1994 | Maeda et al. ........................ 438/761 |
| 5,384,288 | * | 1/1995 | Ying ..................................... 438/431 |
| 5,532,193 | * | 7/1996 | Maeda et al. ........................ 438/784 |
| 5,554,570 | * | 9/1996 | Maeda et al. ........................ 438/763 |
| 5,569,499 | * | 10/1996 | Maeda et al. ........................ 427/539 |
| 5,970,383 | * | 10/1999 | Lee ...................................... 438/788 |
| 5,981,376 | * | 11/1999 | Komatsu .............................. 438/629 |
| 6,025,263 | * | 2/2000 | Tsai et al. ............................ 438/624 |

FOREIGN PATENT DOCUMENTS

| 19651778 | 6/1997 | (DE) . |
| 653782 | 4/1996 | (EP) . |
| 820095 | 1/1998 | (EP) . |
| 6283513 | 10/1994 | (JP) . |
| 750295 | 2/1995 | (JP) . |
| 8203891 | 8/1996 | (JP) . |

OTHER PUBLICATIONS

Fujino, K. et al "Dependence of Deposition Characteristics on Base Materials in TEOS and Ozone CVD at Atmospheric Pressure" J. Electrochem Soc. vol. 138 No.2 Feb. 1991.
Fujino, K. et al "Reaction Mechanism of TEOS and $O_3$ Atmospheric CVD" VMIC Conference Jun. 11–12, 1991.
Fujino, K. et al "Dependence of Deposition Rate on Base Materials" VMIC Conference, Jun. 11–12, 1990.
Patent Abstracts of Japan, 07050295 A, Feb. 21, 1995.
Patent Abstracts of Japan, 06283513 A, Oct. 7, 1994.
Patent Abstracts of Japan, 08203891 A, Aug. 9, 1996.

* cited by examiner

Primary Examiner—Carl Whitehead, Jr.
Assistant Examiner—Jamie L. Davis

(57) ABSTRACT

This invention is directed to a method for reforming an undercoating surface prior to the formation of a film by the CVD technique using a reaction gas containing an ozone-containing gas having ozone contained in oxygen and TEOS. It effects the reform of the surface by forming an undercoating insulating film on a substrate prior to the formation of film and exposing the surface of the undercoating insulating film to plasma gas.

16 Claims, 12 Drawing Sheets

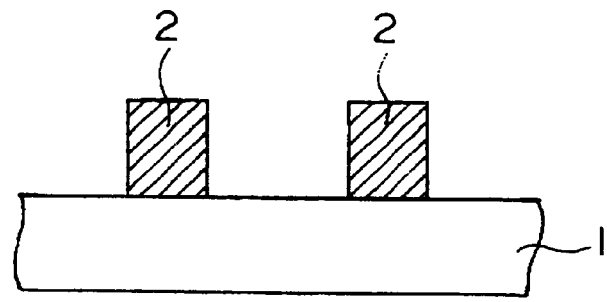
F I G. 5A
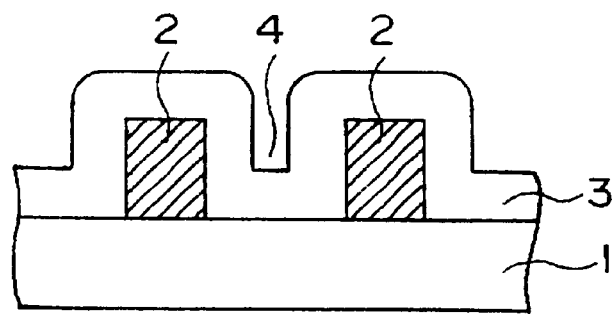
F I G. 5B
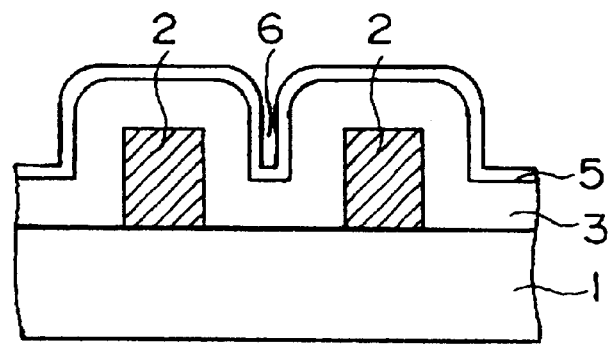
F I G. 5C

US 6,225,236 B1

METHOD FOR REFORMING UNDERCOATING SURFACE AND METHOD FOR PRODUCTION OF SEMICONDUCTOR DEVICE

BACKGROUND OF THE INVENTION

1. Field of the Invention

This invention relates to a method for reforming an undercoating surface prepared for the formation of a film by the CVD (chemical vapor deposition) technique using a reaction gas containing an ozone-containing gas having ozone ($O_3$) contained in oxygen ($O_2$) and tetraethylorthosilicate (TEOS) (hereinafter referred to as "$O_3$/TEOS reaction gas") and a method for the production of a semiconductor device.

2. Description of the Prior Art

The film formed by the CVD technique using the $O_3$/TEOS reaction gas (hereinafter referred to as "$O_3$/TEOS CVD $SiO_2$ film") has the nature of exhibiting high density, a low etching rate, no shrinkage by a heat treatment even at high temperatures, a small water content, and fine flow quality which increases prominently in accordance with increase of as the $O_3$ concentration in $O_2$. The silicon oxide film formed by using an $O_3$/TEOS reaction gas containing $O_3$ in a high concentration (hereinafter referred to as "high $O_3$/TEOS reaction gas") will be referred to as "high $O_3$/TEOS CVD $SiO_2$ film" and the silicon oxide film formed by using an $O_3$/TEOS reaction gas containing $O_3$ in a low concentration (hereinafter referred to as "low $O_3$/TEOS reaction gas") will be referred to as "low $O_3$/TEOS CVD $SiO_2$ film" hereinafter.

The high $O_3$/TEOS CVD $SiO_2$ film relies for its quality in a great measure on the condition of the surface of an undercoating layer. Particularly when a high $O_3$/TEOS CVD $SiO_2$ film is formed on the surface of a $SiO_2$ film or a $Si_3N_4$ film, for example, the film undergoes abnormal growth and acquires a porous texture and a coarse surface as illustrated in FIG. 1 and suffers a decline in the growth rate of a film.

In contrast, when a low $O_3$/TEOS CVD $SiO_2$ film is formed on the surface of an undercoating layer, such abnormal growth as is observed in the high $O_3$/TEOS CVD $SiO_2$ film does not occur in this low $O_3$/TEOS CVD $SiO_2$ film. The low $O_3$/TEOS CVD $SiO_2$ film, however, is inferior in such film qualities as density to the high $O_3$/TEOS CVD $SiO_2$ film.

For the purpose of forming a film of fine flow shape and high quality and conferring on the film an ability to be buried satisfactorily in a narrow depressed area, therefore, it is necessary to form the high $O_3$/TEOS CVD $SiO_2$ film in such a manner that it is not affected by the condition of the surface of an undercoating layer.

Heretofore, the following methods have been adopted for the purpose of depriving a high $O_3$/TEOS CVD $SiO_2$ film prior to its formation of the dependency thereof on the surface of an undercoating film.

(1) A first method consists in exposing the surface of an undercoating layer 120 to plasma as illustrated in FIG. 2A. On the undercoating layer 120 which has been reformed consequently, a high $O_3$/TEOS CVD $SiO_2$ film 121 is formed as illustrated in FIG. 2B.

(2) A second method consists in forming on an undercoating layer 130 a plasma $SiO_2$ film 131 as an undercoating insulating film by the plasma CVD technique as illustrated in FIG. 3A. Thus, a high $O_3$/TEOS CVD $SiO_2$ film 132 is formed on the undercoating insulating film 131 as illustrated in FIG. 3B.

The plasma $SiO_2$ film 131 may acquire satisfactory adaptability for the high $O_3$/TEOS CVD $SiO_2$ film 132 in terms of the formation of a film, depending on the condition of the film formation adopted by the plasma CVD technique during the formation of the plasma $SiO_2$ film 131. When the plasma $SiO_2$ film 131 of fine adaptability is formed as an undercoating insulating film on the surface of the undercoating layer 130 and then the high $O_3$/TEOS CVD $SiO_2$ film 132 is formed on the plasma $SiO_2$ film 131, therefore, the high $O_3$/TEOS CVD $SiO_2$ film 132 consequently obtained acquires fine film qualities.

(3) A third method consists in forming on the surface of an undercoating layer 140 a low $O_3$/TEOS CVD $SiO_2$ film 141 as an undercoating insulating film or forming an $O_3$/TEOS CVD $SiO_2$ film under a low pressure (hereinafter referred to as "low pressure $O_3$/TEOS CVD $SiO_2$ film") 141 as illustrated in FIG. 4A. A high $O_3$/TEOS CVD $SiO_2$ film 142 is formed as illustrated in FIG. 4B on the undercoating insulating film 141. The high $O_3$/TEOS CVD $SiO_2$ film 142 is easily formed because it manifests fine adaptability to the low $O_3$/TEOS CVD $SiO_2$ film or the low pressure $O_3$/TEOS CVD $SiO_2$ film 141.

The conventional methods mentioned above, however, :52 severally encounter the following problems.

(1) With the method which resorts to the exposure of the surface of the undercoating layer 120 to plasma, the success thereof in eliminating the dependency on the surface of the undercoating layer 120 is at the mercy of varieties of the surface of the undercoating layer 120 and the condition of the emission of plasma. The condition of the plasma emission, therefore, cannot be common and standardized inclusively for all kinds of undercoating layer 120 but must be optimized with respect to the status i of an individual undercoating layer 120.

(2) In the case of the method which forms the plasma $SiO_2$ layer 131 as an undercoating insulating film, the plasma $SiO_2$ film 131 has too poor a inferior step coverage to suit application to such an undercoating layer as is furnished with fine and deep grooves.

(3) In the case of the method which forms the low $O_3$/TEOS CVD $SiO_2$ film 141 or the low pressure $O_3$/TEOS CVD $SiO_2$ film 141 as an undercoating insulating film in preparation for the formation of the high $O_3$/TEOS CVD $SiO_2$ film 142, the low $O_3$/TEOS CVD $SiO_2$ film 141 possesses an isotropic film-forming property and requires a thickness of not less than 100 nm for the purpose of averting the influence of the dependency on the surface of the undercoating layer. This film, therefore, is unfit for application to an undercoating layer which is furnished with fine and deep grooves, for example. The low $O_3$/TEOS CVD $SiO_2$ film 141 is unfit for an undercoating insulating film because it has low density as compared with the high $O_3$/TEOS CVD $SiO_2$ film.

SUMMARY OF THE INVENTION

This invention aims to provide a method for reforming an undercoating surface which can be applied even to an undercoating layer possessed of a fine and deep groove (such as, for example, a trench, gap between metal wiring layers, or gap between metal lower layers) while averting the dependency on the surface of an undercoating layer regardless of the condition of the surface of an undercoating layer, and a method for the production of a semiconductor device.

According to the method of this invention for reforming an undercoating surface, an undercoating insulating film is formed on a substrate and the surface of the undercoating insulating layer is further exposed to plasma prior to the formation of a film.

Since the undercoating insulating film is formed on the substrate prior to the formation of a film, the influence of the dependency on the surface of the substrate can be avoided without reference to the condition of the surface of the substrate.

Further, since the surface of the undercoating insulating film is exposed to plasma, the surface of the undercoating insulating film can be reformed. Since this reform is required solely for the surface of the undercoating insulating film formed on the surface of the substrate and not for the inherent surface of the substrate which has a surface condition which varies from kind to kind, the method to be used for the reform of surface can be inclusively common and standardized.

Since the surface of the undercoating insulating film has been reformed when an insulating film, for example, is ready to be formed on the undercoating insulating film, the insulating film can be formed on the undercoating insulating film without being affected by the dependency on the surface of the undercoating film.

It has been confirmed by an experiment conducted by the present inventor that the minimum thickness of the undercoating insulating film which is insusceptible to the influence of the dependency on the surface of a substrate is decreased by exposure to plasma to.

When an undercoating insulating film was formed by using an ozone-containing gas having $O_3$ contained in a concentration of not more than 1% in $O_2$ and tetraethylorthosilicate (TEOS) gas, for example, the smallest thickness at which the produced film became insusceptible of the influence of the dependency on the surface of the substrate was found to be 10 nm.

According to this invention, since the surface of the undercoating insulating film is exposed to plasma, the undercoating insulating film is allowed to gain in density and become no longer susceptible to the influence of the dependency on the surface of the substrate in spite of a decrease in the thickness thereof.

It is demonstrated by the results of the present inventor's experiment that since the undercoating insulating film is allowed to decrease its thickness, it can be formed on a substrate which has a depressed area with a very narrow width on the order of 0.1 $\mu$m such as, for example, a trench, gap between adjacent metal wiring layers, or gap between adjacent metal lower layers.

It has been confirmed that particularly when the undercoating insulating film is formed on the surface of a substrate having a depressed area of a very narrow width by the use of an ozone-containing gas having a low ozone concentration and TEOS, the deposited undercoating insulating film excels in flatness, step coverage, and ease of embedment and enjoys high density.

Further, according to the method of this invention for the production of a semiconductor device, the undercoating insulating film is formed on the substrate prior to the formation of an insulating film, the surface of the undercoating insulating film is reformed by exposure to plasma, and then the insulating film is formed on the reformed surface. This method, therefore, can be applied to a substrate having a fine and deep groove (such as, for example, a trench, gap between metal wiring layers, or gap between metal lower layers). It accordingly allows formation of an insulating film of fine quality without being affected by the dependency on the surface of the substrate.

Particularly when the undercoating insulating film is formed with an ozone-containing gas having ozone contained in a low concentration of not more than 1% and TEOS and an insulating film is formed on the reformed undercoating insulating film with an ozone-containing gas having ozone contained in a high concentration of not less than 4% and TEOS, the undercoating insulating film and the insulating film constitute themselves a favorable combination enjoying highly satisfactory adaptability from the standpoint of film formation.

BRIEF DESCRIPTION OF THE DRAWING

FIG. 5A–FIG. 5E are cross sections illustrating a method for the production of a semiconductor device according to a method for reforming an undercoating surface as one embodiment of this invention.

DESCRIPTION OF THE PREFERRED EMBODIMENT

A method for reforming an undercoating surface prior to the formation of a film according to an embodiment of this invention and a method for the production of a semiconductor device will be described below with reference to diagrams annexed hereto.

FIGS. 5A–5E illustrate a preferred embodiment of the present invention wherein, a low $O_3$/TEOS CVD $SiO_2$ film 5 is formed on a silicon wafer 1, then the surface of the low $O_3$/TEOS CVD $SiO_2$ film 5 is exposed to a $NH_3$ plasma to reform the surface of the low $O_3$/TEOS CVD $SiO_2$ film 5, and thereafter a high $O_3$/TEOS CVD $SiO_2$ film 7 is formed on the surface of the low $O_3$/TEOS CVD $SiO_2$ film 5.

Figure 12:
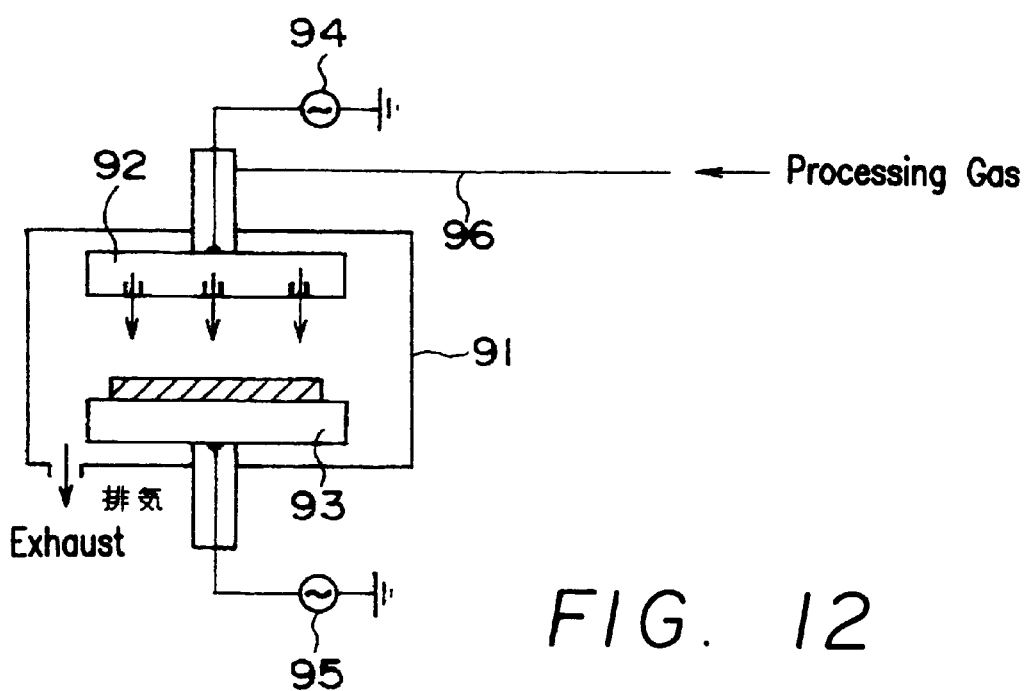
FIG. 12 is a side view illustrating an anode coupling type parallel plate plasma device used for plasma surface reforming treatment according to one working example of this invention.

A parallel plate plasma device of the anode coupling type illustrated in FIG. 12 is used for the exposure of the surface of the low $O_3$/TEOS CVD $SiO_2$ film 5 to the plasma. Inside a chamber 91 of this device, an upper electrode RF 92 and a lower electrode LF 93 are opposed to each other and a high-frequency power source 94 of a frequency of 13.56 MHz is connected to the upper electrode RF 92 and a low-frequency power source 95 of a frequency of 380 KHz is connected to the lower electrode LF 93. A gas inlet pipe 96 is connected to the chamber 91 to introduce the $NH_3$ gas through the gas inlet pipe 96 into the chamber 91.

Next, a method for the treatment of reforming the undercoating surface by the use of the device for reforming the surface described above will be explained below.

FIG. 5 is a cross section illustrating a method for the production of a semiconductor device by the method for reforming an undercoating surface according to the embodiment of this invention.

First, a polysilicon film is formed on a silicon wafer 1 and then the polysilicon film is patterned to form wiring layers 2 as illustrated in FIG. 5A. In this case, the patterning is so carried out as to interpose a gap of 0.5 $\mu$m between the adjacent wiring layers 2.

Next, a silicon nitride film ($Si_2N_{14}$film) 3, 200 nm in thickness, is formed so as to cover the silicon wafer 1 and the wiring layers 2 as illustrated in FIG. 5B. At this time, a groove (depression) 4 coated with the silicon nitride film 3, 0.1 $\mu$m in width and 0.5 $\mu$m in depth, is formed between the adjacent wiring layers 2. The components mentioned above form the substrate.

Then, the $Si_3N_4$ film 3 is heated so that the temperature of the surface thereof reaches 400° C. Thereafter, while the temperature is maintained, the surface of the $Si_3N_4$ film 3 is exposed to a mixed gas consisting of an ozone-containing gas having $O_3$ contained in a low concentration of not more than 1% in $O_2$ and TEOS (hereinafter referred to as "low $O_3$/TEOS reaction gas").

After the elapse of a prescribed time, the low $O_3$/TEOS CVD $SiO_2$ film 5 (undercoating insulating film) is formed on the surface of the $Si_3N_4$ film 3.

In this case, the low $O_3$/TEOS CVD $SiO_2$ film 5 is formed in a thickness of not less than 10 nm. It is for the purpose of covering the interior of the groove 4 of narrow width without degrading the step coverage on the groove 4 of narrow width that the low $O_3$/TEOS CVD $SiO_2$ film 5 is formed in this small thickness of 10 nm. The reason for the lower limit of 10 nm is that this lower limit is necessary for averting the influence of the dependency of the surface of the substrate.

Since the low $O_3$/TEOS CVD $SiO_2$ film 5 is consequently formed inside the groove 4 covered with the $Si_3N_4$ film 3, a groove 6 covered with the low $O_3$/TEOS CVD $SiO_2$ film 5 measures 0.08 $\mu$m in width and 0.49 $\mu$m in depth.

Figure 1:
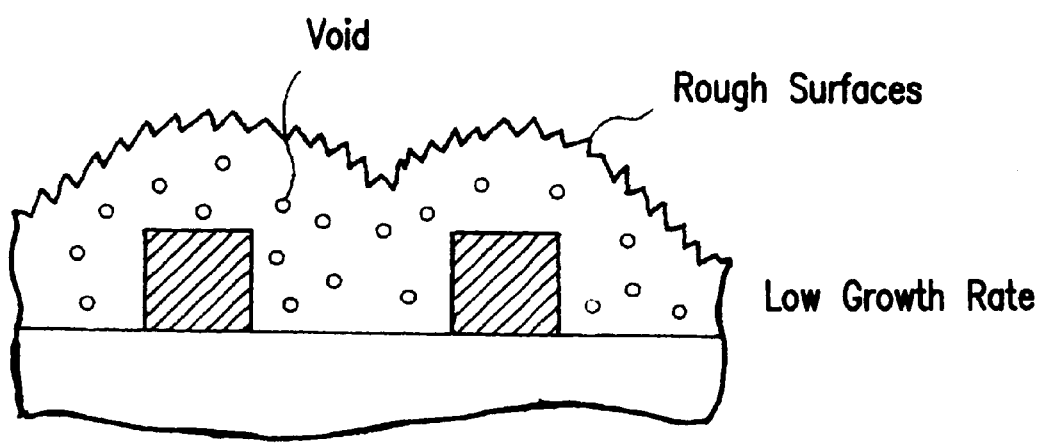
FIG. 1 is a cross section illustrating abnormal growth which occurs when a high $O_3$/TEOS CVD $SiO_2$ film is formed on the surface of a $SiO_2$ film or $Si_3N_4$ film deposited by the conventional technique.
Figure 2A:
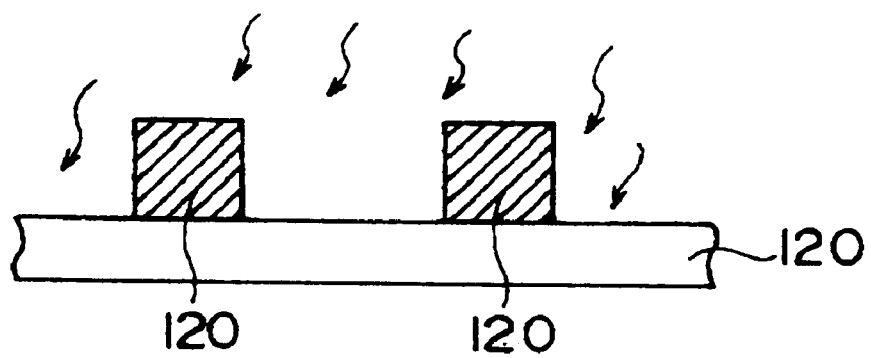
FIG. 2A and FIG. 2B are cross sections illustrating a method for reforming an undercoating surface according to a conventional technique.
Figure 2B:
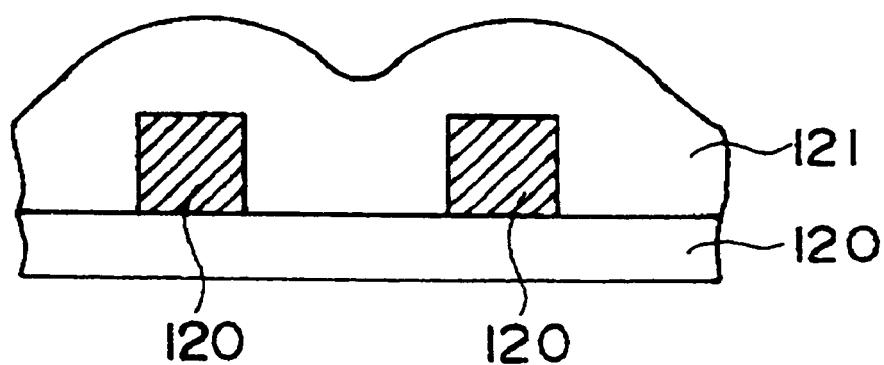
Figure 3A:
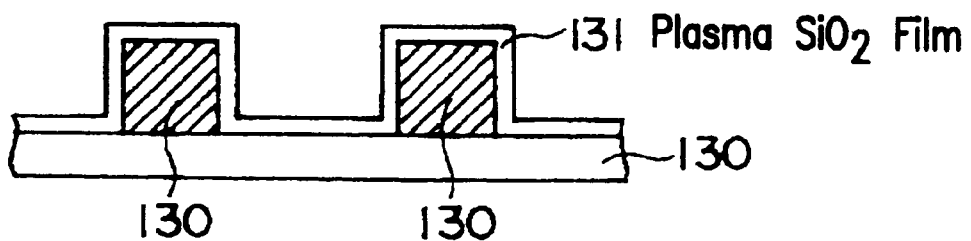
FIG. 3A and FIG. 3B are cross sections illustrating another method for reforming an undercoating surface according to the conventional technique.
Figure 3B:
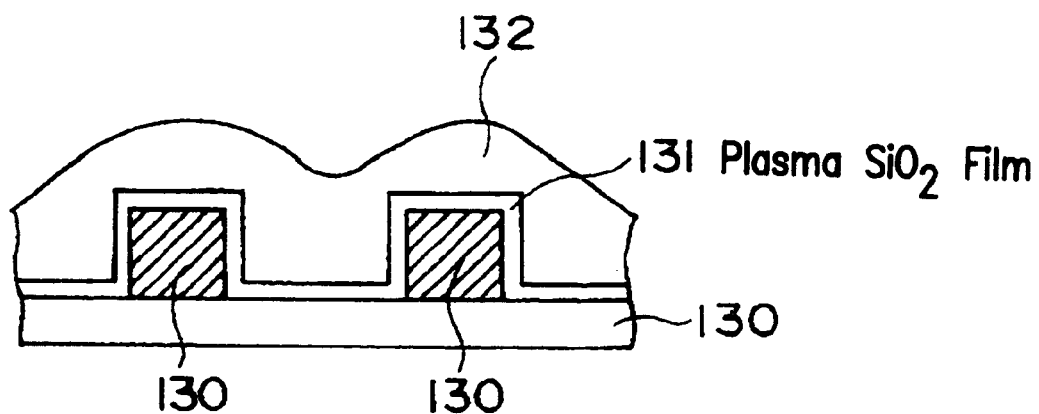
Figure 4A:
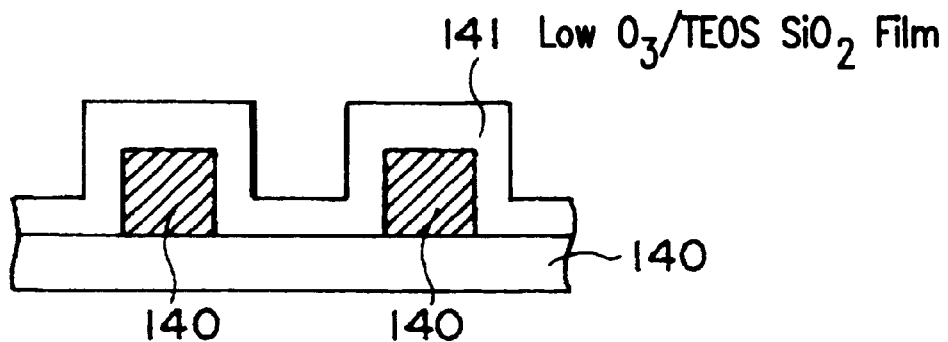
FIG. 4A and FIG. 4B are cross sections illustrating yet another method for reforming an undercoating surface according to the conventional technique.
Figure 4B:
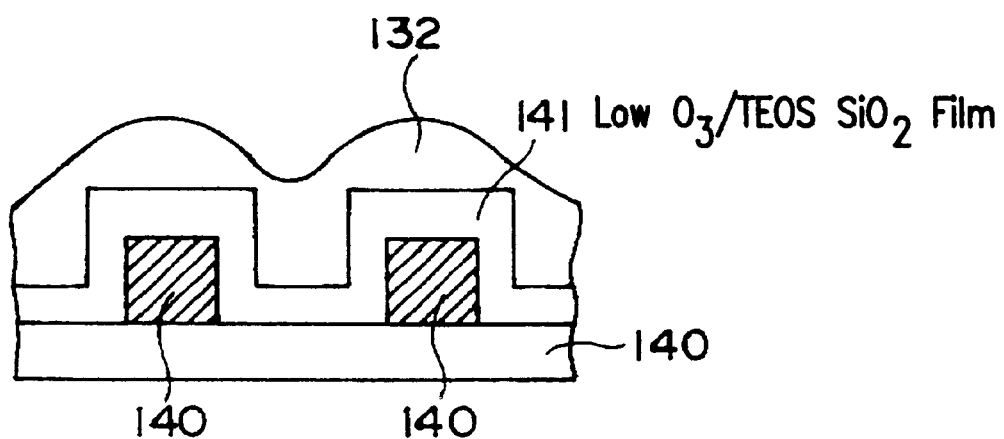
Figure 5D:
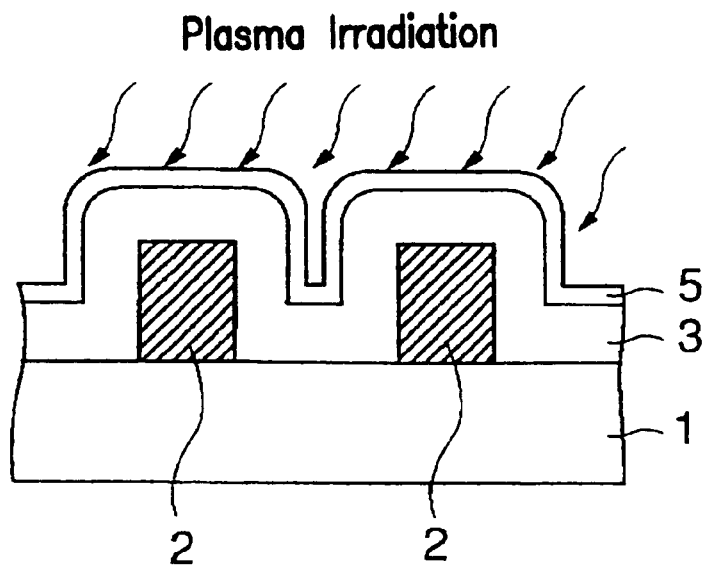

Further, the low $O_3$/TEOS CVD $SiO_2$ film 5 is heated so that the temperature of the surface thereof reaches 350° C. and thereafter while it is maintained at 350° C., the surface of the low $O_3$/TEOS CVD $SiO_2$ film 5 is exposed to a stream of ammonia ($NH_3$) plasma for a period in the approximate range of 15 seconds to five minutes as illustrated in FIG. 5D to reform the surface of low $O_3$/TEOS CVD $SiO_2$ film 5.

At this time, since the surface of the $Si_3N_4$ film 3 is covered with the low $O_3$/TEOS CVD $SiO_2$ film 5, the reforming is performed exclusively on the surface of the low $O_3$/TEOS CVD $SiO_2$ film 5 without reference to the kind of the undercoating film. Thus, the conditions for the reform of the undercoating surface can be inclusively common and standardized.

The reform can densify the low $O_3$/TEOS CVD $SiO_2$ film and enable this film to acquire a quality on a par with the high $O_3$/TEOS CVD $SiO_2$ film. The low $O_3$/TEOS CVD $SiO_2$ film 5, therefore, can avert the influence of (dependency on) the surface of the $Si_3N_4$ film in spite of the decrease of the thickness thereof to 10 nm. The surface of a substrate having fine and deep grooves can be reformed.

Figure 5E:
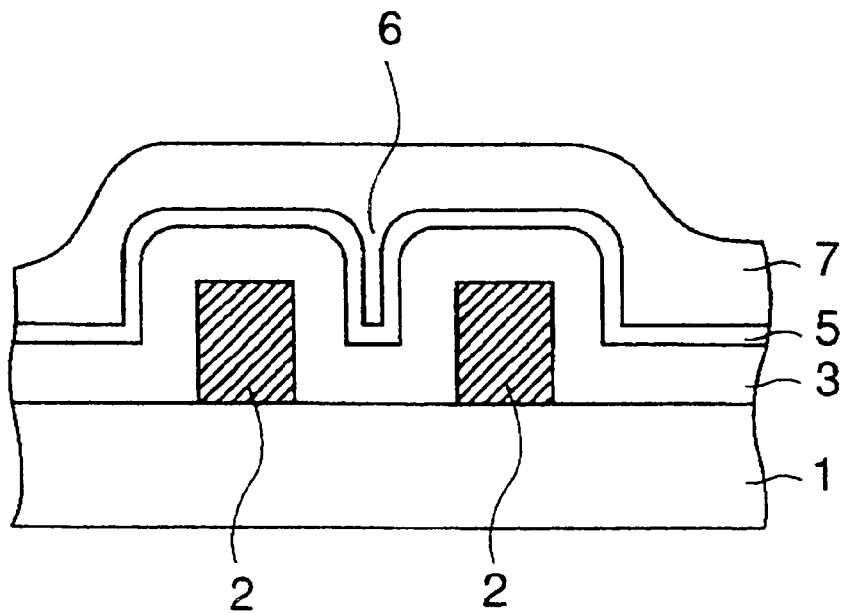

Next, the low $O_3$/TEOS CVD $SiO_2$ film 5 is heated until the temperature of the surface thereof reaches 400° C. and thereafter the high $O_3$/TEOS CVD $SiO_2$ film 7 is formed at 400° C. on the surface of the low $O_3$/TEOS CVD $SiO_2$ film 5 as illustrated in FIG. 5E by the normal pressure CVD technique using a mixed gas of an ozone-containing gas having $O_3$ contained in a high concentration of not less than 4% in $O_2$ and TEOS (hereinafter referred to "high $O_3$/TEOS reaction gas"). At this time, the high $O_3$/TEOS CVD $SiO_2$ film 7 completely fills the interior of the groove 6 and completely cover the low $O_3$/TEOS CVD $SiO_2$ film 5 as well.

The surface of the $Si_3N_4$ film is covered with the low $O_3$/TEOS CVD $SiO_2$ film 5 to preclude the surface of the $Si_3N_4$ film from exerting an influence on the surface thereof and reform the surface of the low $O_3$/TEOS CVD $SiO_2$ film 5 as well. Thus, the high $O_3$/TEOS CVD $SiO_2$ film 7 can be formed on the low $O_3$/TEOS CVD $SiO_2$ film 5 without inducing abnormal growth.

Next, the experiment conducted by the present inventor will be described below. It was carried out to survey the following three items.

Firstly, the ratio of the growth rate of the high $O_3$/TEOS CVD $SiO_2$ film 7 to the thickness of the low $O_3$/TEOS CVD $SiO_2$ film 5 was surveyed to examine the relation between the thickness of the low $O_3$/TEOS CVD $SiO_2$ film 5 and its surface dependency.

Secondly, the ratio of the rate of the high $O_3$/TEOS CVD $SiO_2$ film 7 to the duration of exposure of the surface of the low $O_3$/TEOS CVD $SiO_2$ film 5 to plasma and the dependency of the formation of the high $O_3$/TEOS CVD $SiO_2$ film 7 on the undercoating surface were examined.

Thirdly, the deposited high $O_3$/TEOS CVD $SiO_2$ film 7 was examined for flatness, step coverage, and burying property.

The detail of the experiments mentioned above and their results will be described below.

The low $O_3$/TEOS CVD $SiO_2$ film 5 was formed as an undercoating insulating film on a silicon nitride film. The plasma exposure of the surface of the low $O_3$/TEOS CVD $SiO_2$ film 5 was effected by the use of a stream of $NH_3$ plasma for two minutes.

Figure 6:
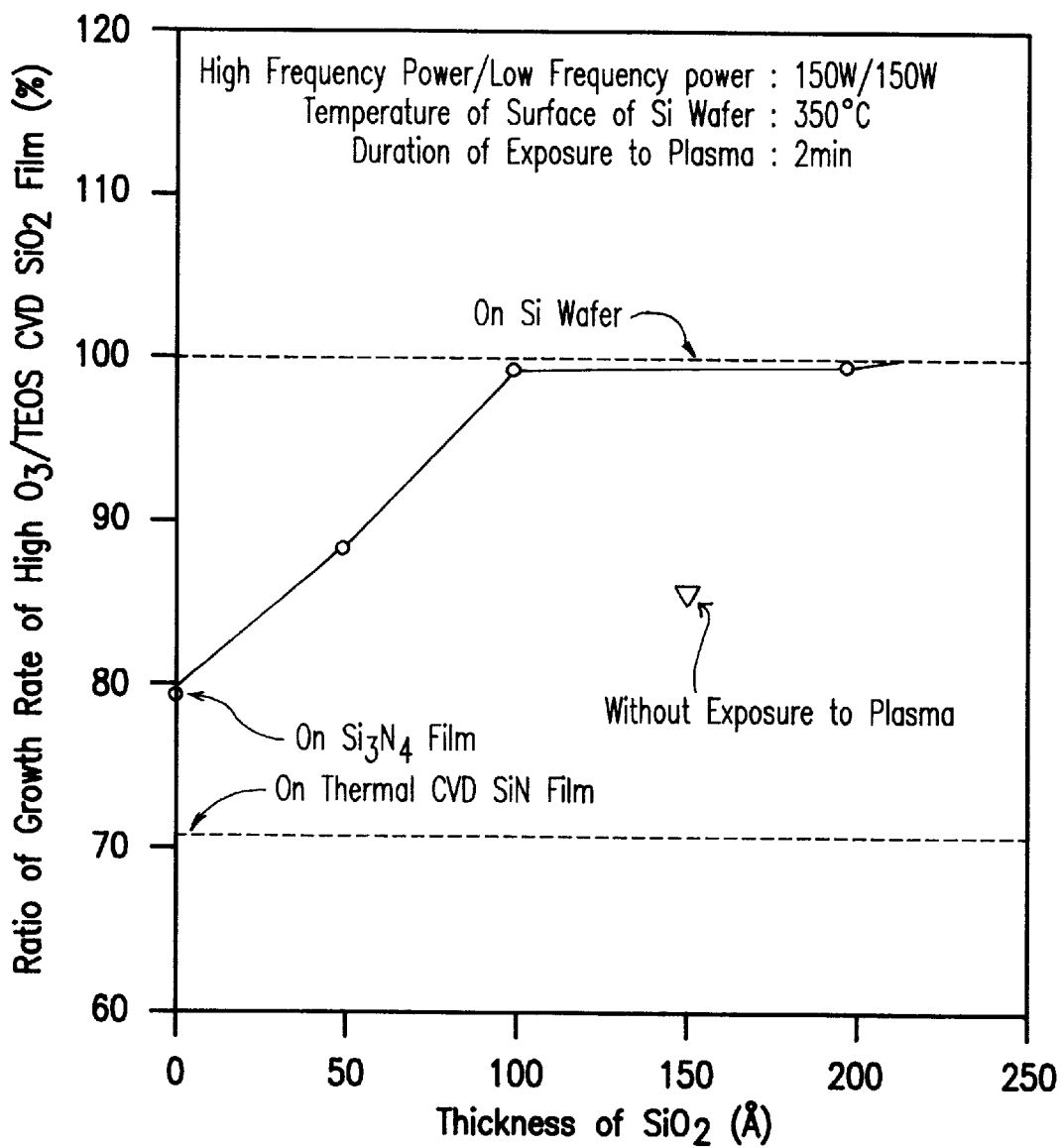
FIG. 6 is a graph showing the ratio of the growth rate of a high $O_3$/TEOS CVD $SiO_2$ film to the thickness of a low $O_3$/TEOS CVD $SiO_2$ film involved in a working example of this invention.

FIG. 6 is a graph showing the ratio of the deposition rate of the high $O_3$/TEOS CVD $SiO_2$ film 7 to the thickness of the low $O_3$/TEOS CVD $SiO_2$ film 5. In the graph, the horizontal axis is the scale of the thickness of the low $O_3$/TEOS CVD $SiO_2$ film 5 and the vertical axis the scale of the the ratio of the deposition rate of the film. The term "ratio of the deposition rate or growth rate" as used herein means the ratio of the deposition rate of the high $O_3$/TEOS CVD $SiO_2$ film 7 on the low $O_3$/TEOS CVD $SiO_2$ film 5 to the deposition rate of the high $O_3$/TEOS CVD $SiO_2$ film 7 directly on the silicon wafer 1.

It is clearly noted from the results shown in FIG. 6 that the deposition rate of the high $O_3$/TEOS CVD $SiO_2$ film 7 was nearly the same as that of deposition on the silicon wafer 1 when the thickness of the low $O_3$/TEOS CVD $SiO_2$ film 5 was not less than 10 nm, that the rate gradually decreased in proportion as the thickness decreased, and the deposition rate approximated closely to about 80% of that on the silicon wafer 1 when the thickness approximated closely to 0 nm.

The results indicate that the deposition rate can be nearly equalized with that on the silicon wafer 1 and the dependency of the formation of the high $O_3$/TEOS CVD $SiO_2$ film 7 on the undercoating surface can be eliminated by increasing the thickness of the low $O_3$/TEOS CVD $SiO_2$ film 5 to a level of not less than 10 nm.

Figure 7:
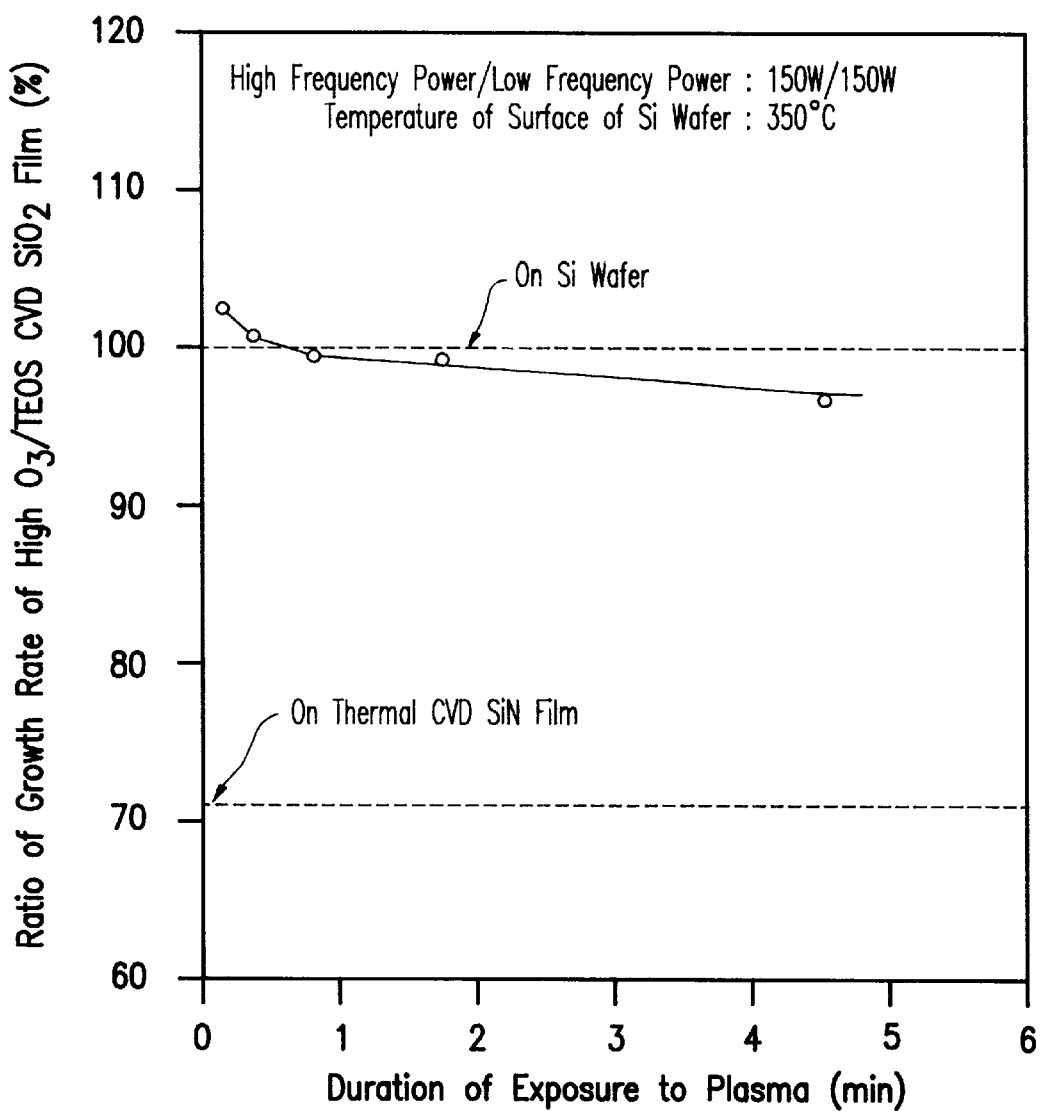
FIG. 7 is a graph showing the ratio of the growth rate of a film to the duration of exposure to plasma involved in a working example of this invention.

FIG. 7 is a graph showing the ratio of the deposition rate or growth rate to the duration of exposure to plasma. In this graph, the horizontal axis is the scale of the duration of exposure of the surface of the low $O_3$/TEOS CVD $SiO_2$ film 5 to plasma and the vertical axis the scale of the deposition rate of the high $O_3$/TEOS CVD $SiO_2$ film 7. The term "ratio of the deposition rate or growth rate" as used herein has the same meaning as in FIG. 6.

In the present case, the thickness of the low $O_3$/TEOS CVD $SiO_2$ film 5 was fixed at 10 nm.

It is clearly noted from FIG. 7 that the deposition rate or growth rate was higher than the deposition rate of the high $O_3$/TEOS CVD $SiO_2$ film 7 directly on the silicon wafer 1 and the dependency on the undercoating surface could be completely eliminated by decreasing the duration of exposure of the low $O_3$/TEOS CVD $SiO_2$ film 5 to a level of not more than about one minute. The results indicate that the deposition rate or growth rate is not suddenly decreased by increasing the duration of the exposure to plasma above one minute and the film formed consequently can amply withstand actual service. It is clear that the effect of improving the dependency on the undercoating surface has a wide margin relative to the duration of the exposure to plasma.

Figure 13A:
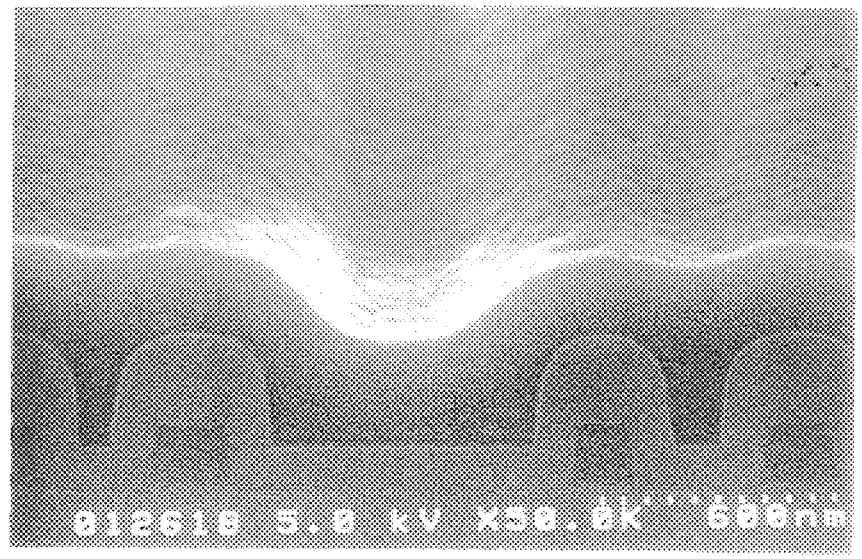
FIG. 13A and FIG. 13B are photographs illustrating the state of a high $O_3$/TEOS CVD $SiO_2$ film formed in a working example of this invention.
Figure 13B:
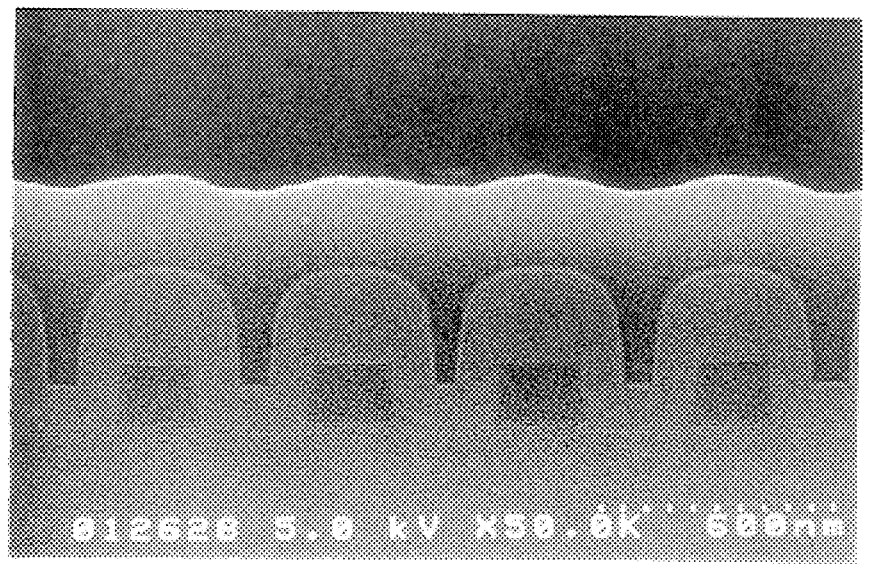

FIGS. 13A and 13B are photographs illustrating the cross-sectional shape and surface condition of a high $O_3$/TEOS CVD $SiO_2$ film 7 formed by the method of production under the condition of production according to the present embodiment of this invention.

It is clearly noted from FIGS. 13A and 13B that the deposited high $O_3$/TEOS CVD $SiO_2$ film 7 excelled in flatness, step coverage, and burying property.

Though the present embodiment, as described above, uses a low $O_3$/TEOS CVD $SiO_2$ film 5, this invention allows use of any film selected from among PSG (phosphosilicate glass) film, BSG (borophosposilicate glass) film, BPSG (borophosphosilicate glass) film, low-pressure $O_3$/TEOS $SiO_2$ film, $SiH_2Cl_2/N_2OSiO_2$ film formed by the reaction of $SiH_2Cl_2$ with $N_2O$, and $O_2$/TEOS $SiO_2$ film formed by the reaction of $O_2$ with TEOS instead. It may be otherwise any of the films mentioned above which were formed by the plasma CVD technique.

A mixed gas of $O_3$ and TEOS with TMP (trimethylphosphite: $P(OCH_3)_3$) or TMOP (trimethylphosphate: $PO(OCH_3)_3$) can be used as the gas for forming the PSG film, a mixed gas of $O_3$ and TEOS with TMB (trimethylborate: $B(OCH_3)_3$) can be used as the gas for forming the BSG film, and a mixed gas of $O_3$ and TEOS and TMB with TMP or TMOP can be used as the gas for forming the BPSG film.

When a film selected from among PSG film, BSG film, BPSG film, and low-pressure $O_3$/TEOS $SiO_2$ film is formed, the $Si_3N_4$ film 3 is heated at the temperature of not lower than 350° C. When either $SiH_2Cl_2/N_2OSiO_2$ film or $O_2$/TEOS $SiO_2$ film is formed, the $Si_3N_4$ film 3 is heated at the temperature of not lower than 650° C.

While the exposure of the surface of the low $O_3$/TEOS CVD $SiO_2$ film 5 to the plasma is in process, the temperature of the heated surface of the low $O_3$/TEOS CVD $SiO_2$ film 5 is only required to exceed normal room temperature and is preferred to be in the range of 100° C.–400° C.

Though the formation of the high $O_3$/TEOS CVD $SiO_2$ film 7, as described above, uses 400° C. as the temperature of the surface of the low $O_3$/TEOS CVD $SiO_2$ film 5, this temperature is only required to exceed 350° C.

As the gas to be used for the plasma treatment, $NH_3$ can bring about the largest effect in the improvement of surface. Optionally, Ar, He, $N_2O$, $N_2$, and $O_2$ may be used in the place of $NH_3$.

First Embodiment

Figure 8:
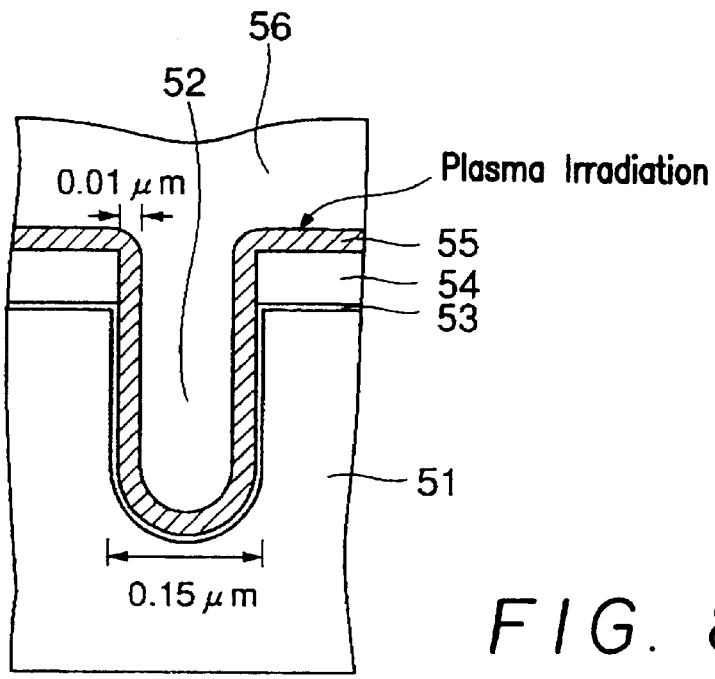
FIG. 8 is a cross section illustrating a case of applying this invention to a trench involved in a working example of this invention.

FIG. 8 is a cross section illustrating a method of this invention for the reform of an undercoating surface as an embodiment of this invention.

In the present embodiment, a trench (depression) 52, 0.1 $\mu$m in width, is formed in a silicon wafer 51 and then an undercoating insulating film is formed to cover this trench 52. Then, the undercoating insulating film is tested for flatness, step coverage, and burying property.

First, a silicon oxide film ($SiO_2$ film) 53 of a small thickness is formed on the silicon wafer 51 and then a $Si_3N_4$ film 54 is formed on the $SiO_2$ film 53.

Next, the resultant superposed films are patterned to remove the parts of the $Si_3N_4$ film 54 and $SiO_2$ film 53 which are destined to form the trench over a width of 150 nm.

Then, with the patterned $Si_3N_4$ film 54 and $SiO_2$ film 53 as masks, the silicon wafer 51 is etched to form a trench 52, 150 nm in width.

Then, the $SiO_2$ film 53 is formed intrench connected to the flat part of the $SiO_2$ film 53, by thermal oxidation on the surface of the silicon wafer 51 exposed inside the trench 52. The steps mentioned above complete the construction of a substrate.

Then, a low $O_3$/TEOS CVD $SiO_2$ film 55 is formed in a uniform thickness of 10 nm on the $SiO_2$ film 53 and $Si_3N_4$ film 54. Thereafter, the surface of the low $O_3$/TEOS CVD $SiO_2$ film 55 is exposed to the $NH_3$ plasma to reform the surface of the low $O_3$/TEOS CVD $SiO_2$ film 55.

Then, a high $O_3$/TEOS CVD $SiO_2$ film 56 is formed on the surface of the low $O_3$/TEOS CVD $SiO_2$ film 55.

In this experiment, though different materials are exposed in the surface of the substrate, the surface of the substrate is covered with the low $O_3$/TEOS CVD $SiO_2$ film 55. Thus, the influence of the surface due to the use of different materials can be prevented from manifesting itself.

Further, the exposure of the low $O_3$/TEOS CVD $SiO_2$ film 55 to the plasma enables the thickness of the low $O_3$/TEOS CVD $SiO_2$ film 55 to be decreased and, as a result, enables the formation of this film in such a depressed area of narrow width as the trench 52 measuring not more than 100 nm in width.

Further, the undercoating insulating film using the low $O_3$/TEOS CVD $SiO_2$ film 55 excels in flatness, step coverage, and burying property.

The embodiment demonstrates that the present invention can be applied to a substrate possessed of such a narrow depressed area as a fine and deep groove, for example.

Second Embodiment

Figure 9:
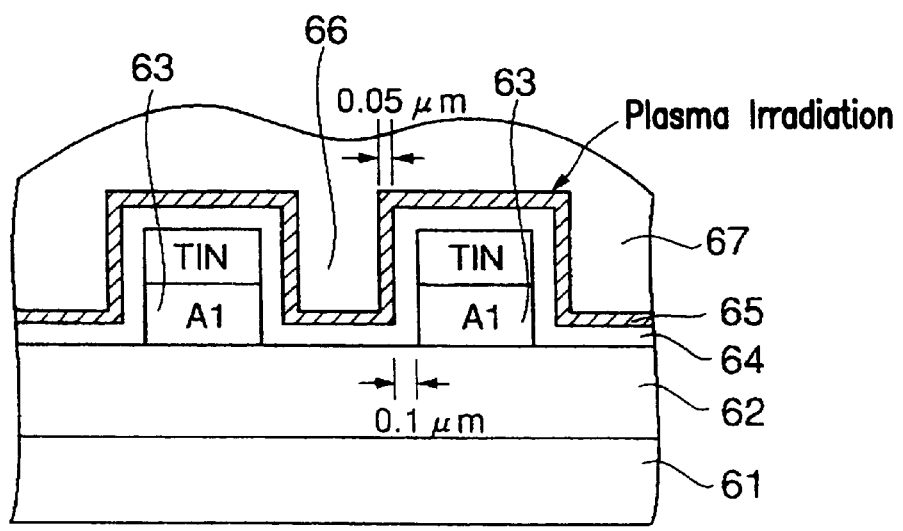
FIG. 9 is a cross section illustrating a case of applying this invention to a gap between metal wiring layers coated with a plasma $SiO_2$ film according to a working example of this invention.

FIG. 9 is a cross section illustrating a method for the reform of an undercoating surface according to the another embodiment and a method for the production of a semiconductor device by the use of the method of surface reform. In the present embodiment, the present invention is applied to a substrate which is composed of a wiring layer formed on an insulating film superposed on a silicon wafer 61 and a plasma $SiO_2$ film covering the wiring layer.

First, a $SiO_2$ film 62 is formed on the silicon wafer 61 and wiring layers 63 made of Al and Tin are formed on the $SiO_2$ film 62.

Then, a plasma $SiO_2$ film 64, 0.1 μm in thickness, is formed to cover the wiring layers 63. The plasma $SiO_2$ film 64 is intended to play the role of protecting the wirings against moisture.

Then, a low $O_3$/TEOS CVD $SiO_2$ film 65, 0.05 μm in thickness, is formed on the part of plasma $SiO_2$ film 64 falling in a groove 66 formed along adjacent wiring layers 63 and on the plasma $SiO_2$ film 64. At this time, the low $O_3$/TEOS CVD $SiO_2$ film 65 is formed in a uniform thickness throughout the entire area because of fine adaptability between low $O_3$/TEOS CVD $SiO_2$ film 65 and the undercoating film.

Then, the surface of low $O_3$/TEOS CVD $SiO_2$ film 65 is exposed to the $NH_3$ plasma to reform the surface of low $O_3$/TEOS CVD $SiO_2$ film 65. Subsequently, a high $O_3$/TEOS CVD $SiO_2$ film 67 is formed on the surface of the low $O_3$/TEOS CVD $SiO_2$ film 65 inside and outside the groove 66.

In the present experiment, because the low $O_3$/TEOS CVD $SiO_2$ film 65 is formed in a decreased thickness, it can be formed in a depressed area of narrow width intervening between adjacent wiring layers covered with the plasma $SiO_2$ film.

Further, owing to the use of the low $O_3$/TEOS CVD $SiO_2$ film 65, the part of the low $O_3$/TEOS CVD $SiO_2$ film 65 formed in the depressed area excels in flatness, step coverage, and burying property.

This embodiment demonstrates that this invention can be applied to a substrate having of such a narrow depressed area as a fine and deep groove, for example.

Third Embodiment

Figure 10:
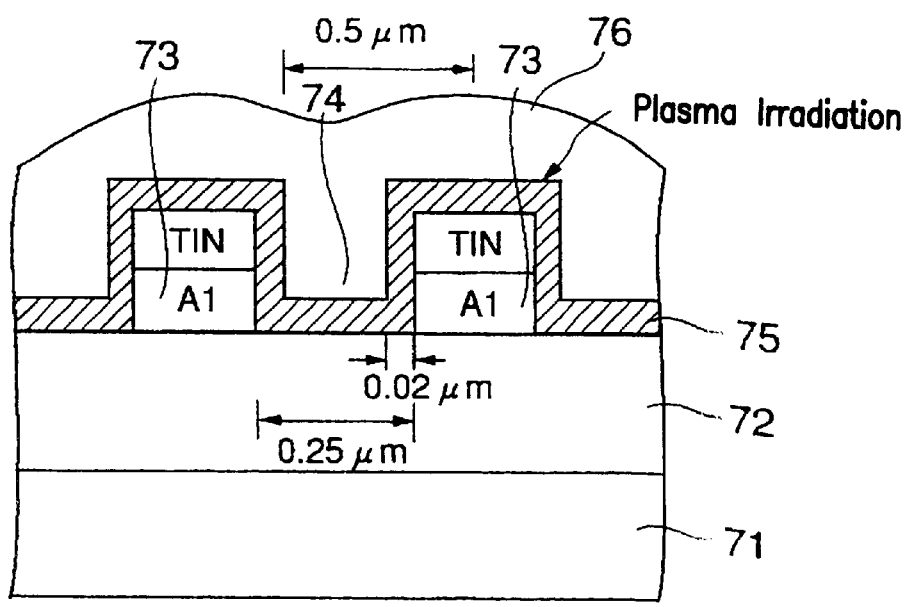
FIG. 10 is a cross section illustrating a case of applying this invention to a gap between metal wiring layers formed of different materials according to one working example of this invention.

FIG. 10 is a cross section illustrating a method for the reform of an undercoating surface according to the present embodiment of this invention and a method for the production of a semiconductor device by the use of the method of surface reform. In the present embodiment, the present invention is applied to a substrate composed of an insulating film of a semiconductor substrate and wiring formed on the insulating film as opposed to each other across a narrow gap. Then, the undercoating insulating film is formed so as to contact the wiring layers directly and coat these wiring layers. That is to say, the undercoating insulating film is formed directly on the substrate which allows the different materials of the insulating film and the conductor films exposed in the surface thereof.

First, a $SiO_2$ film 72 is formed on a silicon wafer 71 and wiring layers 73 made of Al and TiN are formed on the $SiO_2$ film 72. These wiring layers 73 are formed so that the adjacent wiring layers are separated with a gap of 250 nm. The components mentioned above complete the substrate.

Then, a low $O_3$/TEOS CVD $SiO_2$ film 75, 20 nm in thickness, is formed to cover the wiring layers 73 on the $SiO_2$ film 72. In this case, since the low $O_3$/TEOS CVD $SiO_2$ film 75 is not markedly susceptible to the influence of the undercoating surface, the produced low $O_3$/TEOS CVD $SiO_2$ film 75 acquires a uniform thickness throughout inside and outside a groove 74 between the adjacent wiring layers 73.

Then, the surface of the low $O_3$/TEOS CVD $SiO_2$ film 75 is exposed to the $NH_3$ plasma to reform the surface of the low $O_3$/TEOS CVD $SiO_2$ film 75 and thereafter a high $O_3$/TEOS CVD $SiO_2$ film 76 is formed on the surface of the low $O_3$/TEOS CVD $SiO_2$ film 75 inside and outside the groove 74.

In this experiment, since the surface of the substrate allowing the different materials to expose in the surface thereof is coated with the low $O_3$/TEOS CVD $SiO_2$ film 75, the dependency on the surface due to the exposure of different materials can be curbed. Thus, a high $O_3$/TEOS CVD $SiO_2$ film 76 can be formed on the low $O_3$/TEOS CVD $SiO_2$ film 75 without being affected by the dependency on the surface.

Further, since the low $O_3$/TEOS CVD $SiO_2$ film 75 is narrow formed in a decreased thickness, it can be formed in a depressed area interposed between adjacent wiring layers. Furthermore, the part of the low $O_3$/TEOS CVD $SiO_2$ film 75 which is formed in the depressed area excels in flatness, step coverage, and burying property. This embodiment demonstrates that this invention can be applied to the reform of the surface of a substrate possessed of a narrow depressed area such as, for example, a fine and deep groove.

Fourth Embodiment

Figure 11:
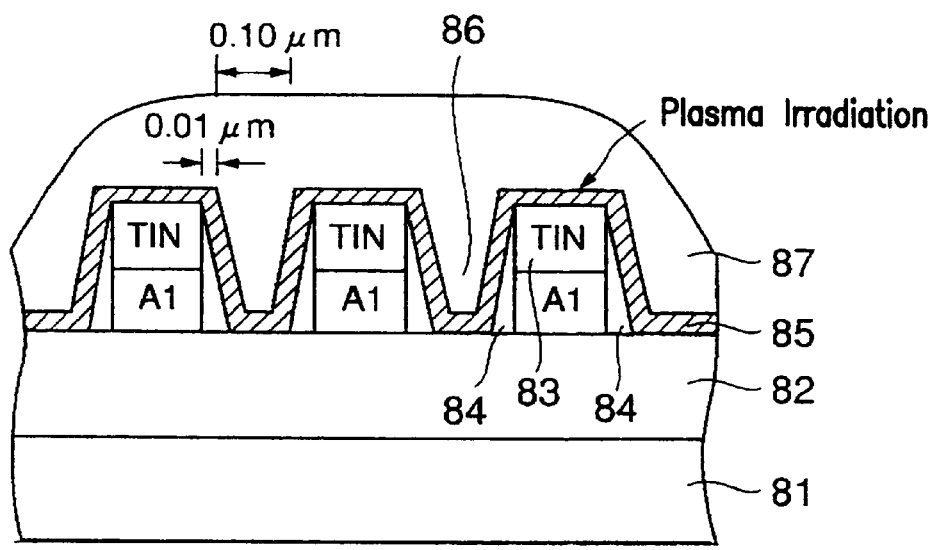
FIG. 11 is a cross section illustrating a case of applying this invention to a gap between metal lower layers provided in the lateral parts of wiring layers with a side wall spacers according to a working example of this invention.

FIG. 11 is a cross section illustrating a method for reforming an undercoating surface according to the present embodiment. In the present embodiment, the undercoating insulating film is formed to cover wiring layers which are provided on the lateral parts thereof with a side wall spacer. The side wall spacers alleviates the difference of step to be formed when the undercoating insulating film is covered.

First, a $SiO_2$ film 82 is formed on a silicon wafer 81 and then wiring layers 83 made of Al and TiN are formed on the $SiO_2$ film 82. The wiring layers 83 are formed such that the adjacent wiring layers are separated with a gap of 100 nm.

Then, a $SiO_2$ (or $SI_3N_4$) film is formed to cover the wiring layers 83 and then the opposite lateral sides of the wiring layers 83 are anisotropically etched to form side wall spacers 84. As a result, the lateral sides of the wiring layers 83 assume a downward diverging shape and alleviate the difference of step. Grooves consequently occur between the side wall spacers 84. The components mentioned above complete the construction of the substrate.

Then, a low $O_3$/TEOS CVD $SiO_2$ film 85, 10 nm in thickness, is formed to cover the wiring layers 83. At this time, the low $O_3$/TEOS CVD $SiO_2$ film 85 is formed in a uniform thickness inside and outside the grooves.

Then, the surface of the low $O_3$/TEOS CVD $SiO_2$ film 85 is exposed to the $NH_3$ plasma to reform the surface of the low $O_3$/TEOS CVD $SiO_2$ film 85.

Then, a high $O_3$/TEOS CVD $SiO_2$ film 87 is formed on the surface of the substrate which allows the different materials to expose in the surface thereof.

As a result, the low $O_3$/TEOS CVD $SiO_2$ film 85 is allowed to coat the surface of the substrate exposing the different materials and, therefore, curbs adverse effect of the dependency on the surface due to the exposure of different materials. Thus, the high $O_3$/TEOS CVD $SiO_2$ film 87 can be formed on the low $O_3$/TEOS CVD $SiO_2$ film 85 without being affected by surface dependency.

Since the low $O_3$/TEOS CVD $SiO_2$ film 85 is formed in a decreased thickness, it can be formed in a narrow depressed area between the adjacent wiring layers. Further, the part of low $O_3$/TEOS CVD $SiO_2$ film 85 formed in the depressed area excels in flatness, step coverage, and burying property. The present embodiment demonstrates that this invention can be applied to the reform of the surface of a substrate possessed of a narrow depressed area such as, for example, a fine and deep groove.

The method of this invention for the reform of the undercoating surface consists in forming an undercoating insulating film on a substrate prior to the formation of an insulating film, for example, and further exposing the surface of the undercoating insulating film to plasma as described above.

Since the undercoating insulating film is formed on the substrate prior to the formation of the insulating film, it can avert the influence of the substrate on the surface thereof.

Since the surface of the undercoating insulating film is exposed to plasma, the surface of the undercoating insulating film can be reformed. In this case, it is not the inherent surface of the substrate but the surface of the undercoating insulating film formed on the surface of the substrate that is to be subjected to the reform. The method for the reform of the surface, therefore, can be inclusively standardized.

When an insulating film, for example, is to be formed on the undercoating insulating film, this formation of the film can be infallibly accomplished without being affected by the dependency on the undercoating surface because the surface of the undercoating insulating film has been already reformed.

Further, the plasma exposure of the surface of the undercoating insulating film enables the undercoating insulating film to be densified and freed from the influence of the surface of the substrate even when the thickness of the undercoating insulating film is decreased.

As a result, the undercoating insulating film can be formed on a substrate having a depressed area of unusually narrow width. Particularly when the undercoating insulating film is formed on the surface of a substrate having a depressed area of unusually narrow width by the use of an ozone-containing gas having ozone contained in a low concentration and TEOS, the deposited undercoating insulating film excels in flatness, step coverage, and burying property and manifests high density.

The method of this invention for the production of a semiconductor device consists in forming an undercoating insulating film on a substrate prior to the formation of an insulating film, then reforming the surface of the undercoating insulating film by plasma exposure, and thereafter forming the insulating film on the reformed surface.

The method, therefore, can be applied to a substrate having a fine and deep groove, for example, and can form an insulating film of fine quality without being affected by the dependency on the surface of the substrate. Particularly when the undercoating insulating film is formed by the use of an ozone-containing gas having ozone contained in a low concentration of not more than 1% and TEOS and the insulating film is formed on the reformed undercoating insulating film by the use of an ozone-containing gas having ozone contained in a high concentration of not less than 4% and TEOS, the undercoating insulating film and the insulating film constitute themselves a favorable combination enjoying highly satisfactory adaptability from the standpoint of film formation.

What is claimed is:

1. A method for forming an undercoating insulating film of silicon oxide, on a surface of a substrate having a depression, to prevent the substrate surface from influencing subsequent formation of another film, comprising the steps of:
    covering the substrate surface with the undercoating insulating film of silicon oxide to a thickness of 10–50 nm, said undercoating insulating film of silicon oxide conforming to the contour of said depression thereby maintaining the depression; and
    exposing a surface of said undercoating insulating film to plasma gas thereby reforming said surface; and
    forming an insulating film directly onto the reformed surface of the undercoating insulating film of silicon oxide while filling the depression to form a planarized surface over the depression, thus eliminating its contour.

2. A method according to claim 1, wherein said depressed area is a groove formed in said substrate or a depression between adjacent wiring layers formed on an insulating layer.

3. A method according to claim 1, further comprising forming a silicon nitride film on said substrate surface prior to said covering with the undercoating insulating film.

4. A method according to claim 1, wherein said undercoating insulating film is one member selected from the group consisting of silicon oxide film, PSG film, BSG film, and BPSG film.

5. A method according to claim 1, wherein said undercoating insulating film is a silicon oxide film formed by reaction of tetraethylorthosilicate with an ozone-containing gas.

6. A method according to claim 5, wherein said ozone containing gas is oxygen containing not more than 1% ozone.

7. A method according to claim 1, wherein said undercoating insulating film is a silicon oxide film formed by reaction of $SiH_2Cl_2$ with $N_2O$.

8. A method according to claim 1, wherein said silicon oxide film is formed by reaction of tetraethylorthosilicate with oxygen.

9. A method according to claim 1, wherein said substrate is heated while the surface of said undercoating insulating film is exposed to the plasma gas.

10. A method according to claim 9, wherein said substrate is heated to a temperature exceeding normal room temperature.

11. A method according to claim 10, wherein the temperature to which said substrate is heated is not lower than 100° C. and not higher than 400° C.

12. A method according to claim 1, wherein said plasma gas is formed of at least one member selected from among $NH_3$, He, Ar, $O_2$, $N_2$, and $N_2O$.

13. A method for the production of a semiconductor device comprising:
    a. providing a substrate having a conductor pattern formed thereon to present a substrate surface having exposed surface areas formed of said conductor and exposed surface areas of the substrate, said conductor pattern defining at least one depressed area between adjacent conductors;
    b. covering said substrate surface with a first silicon oxide film, formed as an undercoating insulating film by reaction of oxygen containing a low concentration of ozone of not more than 1% with tetraethylorthosilicate, said first silicon oxide film having a thickness of 10–50 nm and conforming to the contour of the depressed area, thereby maintaining the depressed area;

c. reforming a surface of said first silicon oxide film by exposing said surface of said silicon oxide film to a plasma gas; and d. forming a second silicon oxide film covering and in contact with the reformed surface of first silicon film, by reaction of oxygen containing not less than 4% ozone with tetraethylorthosilicate, and filling the depressed area with the thus formed second silicon oxide film to form a planarized surface over the depressed area, thus eliminating its contour.

14. A method according to claim 13 additionally comprising, prior to step b, forming a silicon nitride film over the substrate surface.

15. A method according to claim 13 wherein said plasma is formed of at least one gas selected from the group consisting of $NH_3$, He, Ar, $O_2$, $N_2$ and $N_2O$.

16. A method according to claim 13 wherein said substrate is heated to a temperature of 100–400° C. while said first silicon oxide film is exposed to the plasma.

* * * * *

UNITED STATES PATENT AND TRADEMARK OFFICE
CERTIFICATE OF CORRECTION

PATENT NO. : 6,225,236 B1
DATED : May 1, 2001
INVENTOR(S) : Nishimoto et al.

It is certified that error appears in the above-identified patent and that said Letters Patent is hereby corrected as shown below:

Column 1,
Line 23, delete "as".

Column 2,
Line 24, delete ":52";
Line 33, delete "i"; and
Line 37, delete "inferior".

Column 3,
Line 27, delete "plasma to" insert -- plasma --.

Column 5,
Line 34, "$Si_2N_{14}$" should read -- $Si_3N_4$ --.

Column 6,
Line 54, "detail" should read -- details --.

Column 8,
Line 41, "intrench" should read -- in trench --.

Column 10,
Line 26, delete "narrow".

Column 12,
Line 43, "1" should read -- 4 --.

Signed and Sealed this

Sixteenth Day of July, 2002

Attest:

JAMES E. ROGAN
Attesting Officer *Director of the United States Patent and Trademark Office*